United States Patent
Park

(10) Patent No.: US 6,534,370 B2
(45) Date of Patent: Mar. 18, 2003

(54) METHOD FOR FABRICATING A SEMICONDUCTOR DEVICE HAVING AN ELEVATED SOURCE/DRAIN SCHEME

(75) Inventor: Geun-Sook Park, Choongcheongbuk-Do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/776,753

(22) Filed: Feb. 6, 2001

(65) Prior Publication Data

US 2002/0022327 A1 Feb. 21, 2002

(30) Foreign Application Priority Data

Aug. 16, 2000 (KR) ........................................ 2000-47184

(51) Int. Cl.[7] .................................................. H01L 21/336
(52) U.S. Cl. ........................ 438/300; 438/589; 430/312
(58) Field of Search ................................. 438/300, 589, 438/FOR 296, FOR 193; 430/312

(56) References Cited

U.S. PATENT DOCUMENTS

| | | | | |
|---|---|---|---|---|
| 4,453,305 A | * | 6/1984 | Janes et al. | 257/330 |
| 4,830,975 A | * | 5/1989 | Bovaird et al. | 148/DIG. 116 |
| 5,157,003 A | * | 10/1992 | Tsuji et al. | 438/401 |
| 5,270,257 A | * | 12/1993 | Shin | 257/244 |
| 5,514,498 A | * | 5/1996 | Nakagawa | 430/5 |
| 5,583,064 A | * | 12/1996 | Lee et al. | 257/332 |
| 6,303,448 B1 | * | 10/2001 | Chang et al. | 438/300 |
| 2002/0132189 A1 | * | 9/2002 | Huang et al. | 430/312 |
| 2002/0136964 A1 | * | 9/2002 | Pierrat | 430/5 |

* cited by examiner

*Primary Examiner*—George Fourson
(74) *Attorney, Agent, or Firm*—Morgan, Lewis & Bockius LLP

(57) ABSTRACT

The present invention is a method for fabricating a semiconductor device having an elevated source/drain scheme which includes the steps of: forming a first photoresist film on a top surface of a semiconductor substrate; forming a second photoresist film on the first photoresist film; forming the second photoresist film; forming a second photoresist film pattern so that a portion corresponding to a field region has a first opening and a region in which a gate electrode is to be formed has a second opening by exposing the second photoresist film to a first light, thereby developing the second photoresist film; forming a first photoresist film pattern so that a portion corresponding to the field region has a third opening by exposing the first photoresist film to a second light, thereby developing the first photoresist film; forming a first trench at the first opening position and a second trench at the second opening position on the semiconductor substrate by etching the semiconductor substrate using the first photoresist film pattern and the second photoresist film pattern as a mask; filling the first trench and the second trench with an oxide film; removing the oxide film in the second trench; forming a gate oxide film on inner walls of the first and second trenches and on the top surface of the semiconductor substrate; forming a gate electrode on a top surface of the second trench by forming a conductive layer on a top surface of the gate oxide film and patterning the gate oxide film; and forming a source junction and a drain junction by implanting impurity ions in the semiconductor substrate at both sides of the gate electrode.

7 Claims, 5 Drawing Sheets

US 6,534,370 B2

METHOD FOR FABRICATING A SEMICONDUCTOR DEVICE HAVING AN ELEVATED SOURCE/DRAIN SCHEME

This application claims the benefit of Application No. 47184/2000, filed in Korea on Aug. 16, 2000, which is hereby incorporated by reference.

BACKGROUND OF THE INVENTION

1. Field of the Invention

The present invention relates to a method for fabricating a semiconductor device, and more particularly, to a method for fabricating a semiconductor device having an elevated source/drain scheme.

2. Description of the Related Art

Recently, as the degree of integration of a semiconductor device increases, the length of a gate becomes smaller. Due to this, a number of problems referred to as a short channel effect occur, in particular, a punch through phenomenon is a serious problem. Thus, people become more concerned with a method for increasing the degree of integration of the device and at the same time suppressing the generation of a punch through phenomenon.

To satisfy this concern, a semiconductor device having an elevated source/drain scheme is devised.

A normal semiconductor device according to the conventional art includes a gate electrode formed on the top surface of a semiconductor substrate, source/drain junctions formed in the semiconductor substrate at both sides of the gate electrode, and a channel region between the source junction and the drain junction. That is, the top surface of the source/drain junctions is positioned on the same plane with the top surface of the channel region. In a semiconductor device having an elevated source/drain scheme, however, a channel is formed around the surface of the semiconductor substrate below the gate electrode as in the conventional art, while a source/drain is formed by selectively growing an epitaxial silicon layer on the top surface of the semiconductor substrate, thus making the top surface of the source/drain higher than the top surface of the channel.

The structure of the semiconductor device having an elevated source/drain scheme will now be described with reference to FIG. 1.

At a predetermined portion of a semiconductor substrate 10, a field oxide film 20 is formed in order to define an active region. That is, a portion at which the field oxide film 20 is not formed is an active region. On the top surface of the semiconductor substrate 10, a gate oxide film 11 is formed, and on the top surface of the gate oxide film 11, a gate electrode 12 is formed. In addition, a side wall spacer 13 is formed at the sides of the gate oxide film 12. In addition, a source extrusion portion 14a and a drain extrusion portion 15a are formed on the top surface of the semiconductor substrate at both sides of the gate electrode 12. A source junction 14b is formed within the semiconductor substrate 10 below the source extrusion portion 14a, and a drain junction 15b is formed within the semiconductor substrate 10 below the drain extrusion portion 15a. A channel 16 is formed within the semiconductor substrate 10 between the source junction 14b and the drain junction 15b.

In other words, in the semiconductor device of FIG. 1, a source 14 is a combination of the source extrusion portion 14a and the source junction 14b, and a drain 15 is a combination of the drain extrusion portion 15a and the drain junction 15b. By making such a scheme, it is advantageous in that the depth of the source junction 14b and drain junction 15b becomes much smaller than that of the conventional semiconductor device.

However, in the semiconductor device having an elevated source/drain scheme according to the conventional art, there occurs a problem in the method therefor. That is, the source extrusion portion 14a and the drain extrusion portion 15a are generally formed by the epitaxial deposition method. However, the source extrusion portion 14a and the drain extrusion portion 15a formed by the epitaxial deposition method each have a facet 17 at their peripheral portion. In other words, the peripheral portion is formed thinner than the central portion is. Due to this, when ions are implanted so as to form the source/drain junctions 14b and 15b, the impurity ions are deeply implanted below the facet 17. That is, a deep junction is formed within the semiconductor substrate around the gate electrode 12, thus making it ineffective to prevent a punch through.

SUMMARY OF THE INVENTION

Accordingly, the present invention provides a method for fabricating a semiconductor device having an elevated source/drain scheme without using the epitaxial growing method.

In addition, the present invention provides a method for fabricating a semiconductor device having an elevated source/drain scheme using a dual photoresist process of ArF photoresist and KrF photoresist in such a manner that a conventional process is not much changed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve the above objects, there is provided a method for fabricating a semiconductor device having an elevated source/drain scheme according to the present invention which includes the steps of: forming a first photoresist film on a top surface of a semiconductor substrate; forming a second photoresist film on the first photoresist film; forming a second photoresist film pattern so that a portion corresponding to a field region has a first opening and a region in which a gate electrode is to be formed has a second opening by exposing the second photoresist film to a first light, thereby developing the second photoresist film; forming a first photoresist film pattern so that a portion corresponding to the field region has a third opening by exposing the first photoresist film to a second light, thereby developing the first photoresist film; forming a first trench at the first opening position and a second trench at the second opening position on the semiconductor substrate by etching the semiconductor substrate using the first photoresist film pattern and the second photoresist film pattern as a mask; filling the first trench and second trench with an oxide film; removing the oxide film in the second trench; forming a gate oxide film on the inner walls of the first and second trenches and on the top surface of the semiconductor substrate; forming a gate electrode on the top surface of the second trench by forming a conductive layer on a top surface of the gate oxide film and patterning the gate oxide film; and forming a source junction and a drain junction by implanting impurity ions in the semiconductor substrate at both sides of the gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

A preferred method for fabricating a semiconductor device having an elevated source/drain scheme according to the present invention will now be described with reference to the accompanying drawings.

Figure 1:
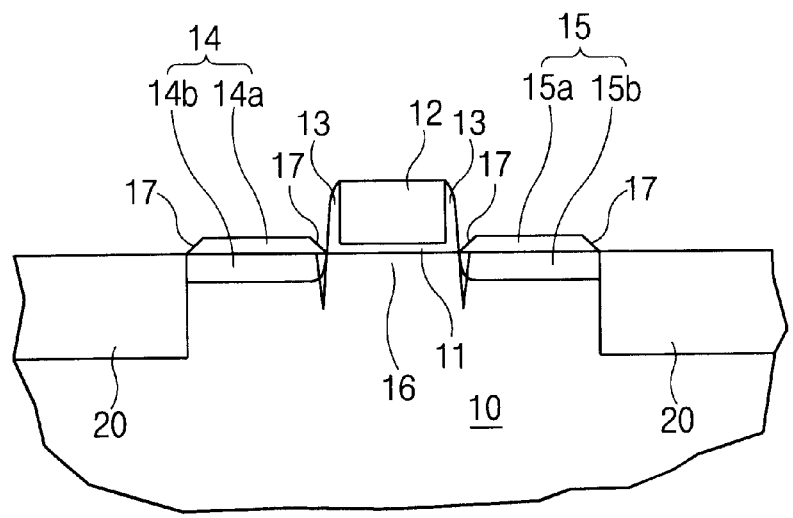
FIG. 1 is a cross-sectional view of a semiconductor device having an elevated source/drain scheme according to the conventional art.
Figure 2A:
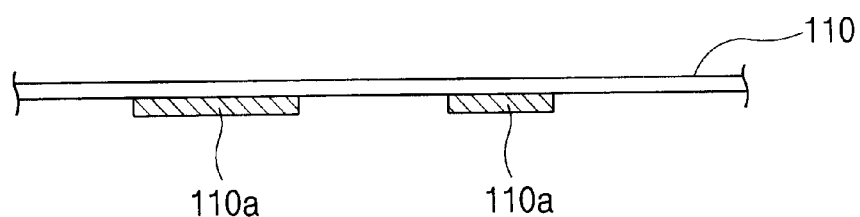
FIGS. 2a through 2i illustrate a sequence of a process for fabricating a semiconductor device having an elevated source/drain scheme according to the present invention.
Figure 2A:
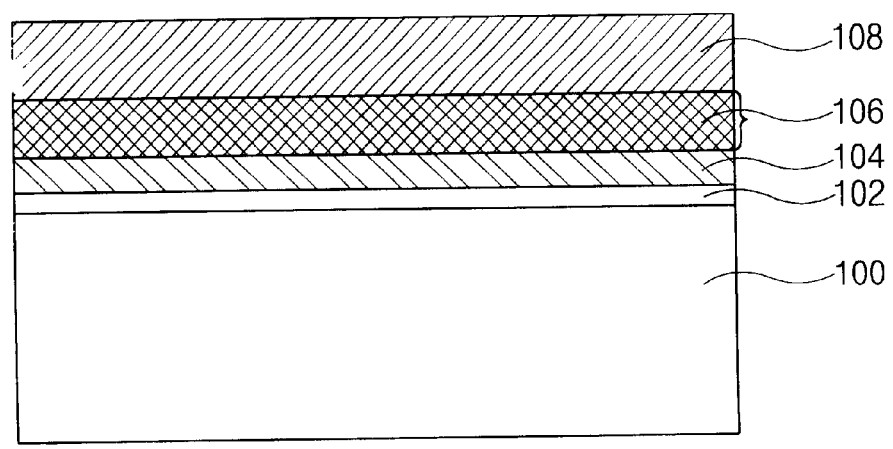

First, as illustrated in FIG. 2a, a pad oxide film 102 and a nitride film 104 are sequentially formed on a top surface of a semiconductor substrate 100. Next, a first photoresist film 106 is formed on the top surface of the nitride film 104. The first photoresist film 106 is made of KrF exposure photoresist. Then, a second photoresist film 108 is formed on a top surface of the first photoresist film 106. A second photoresist film 108 is made of ArF exposure photoresist.

Next, a first mask 110 having a shading pattern 110a in a field region and in a region in which a gate electrode is to be formed is installed at an upper part of the semiconductor substrate 100.

Figure 2B:
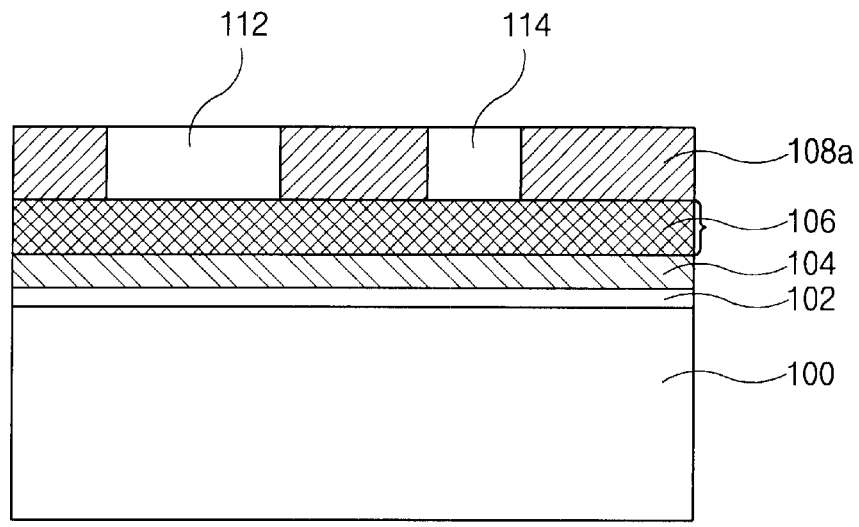

Next, as illustrated in FIG. 2b, a second photoresist pattern 108a having a first opening 112 at a position corresponding to the field region and a second opening 114 corresponding to the shape of the gate electrode is formed by exposing the second photoresist film 108 to ArF and developing the second photoresist film 108.

Figure 2C:
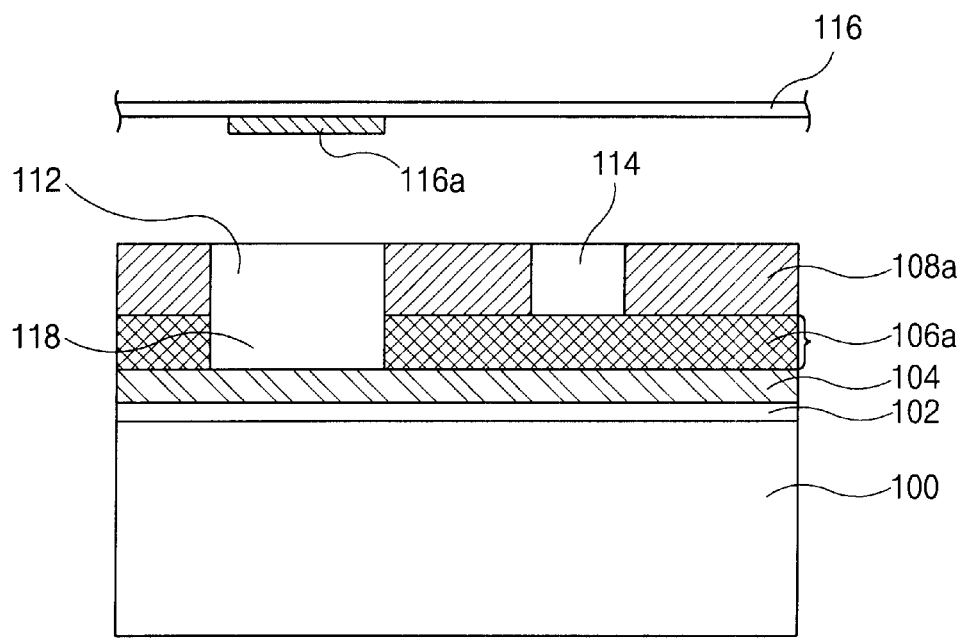

Next, as illustrated in FIG. 2c, a second mask 116 having a shading pattern 116a only in a portion corresponding to the field region is installed on the structure of FIG. 2b, and is exposed to KrF.

After the shading pattern 116a is developed after the KrF exposure, a first photoresist pattern 106a having a third opening 118 is formed in a portion corresponding to the field region. At this time, the first opening 112 and the third opening 118 overlap at the same position.

Figure 2D:
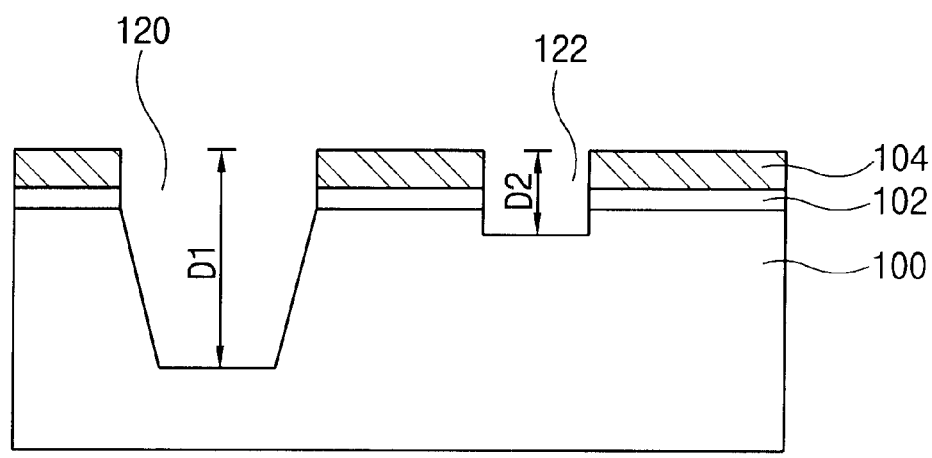

Next, the structure of FIG. 2d is made by anisotropic etching the semiconductor substrate 100 using the first photoresist pattern 106a and the second photoresist pattern 108a as an etching mask. That is, the semiconductor substrate 100 is etched at the first opening 112 portion as deeply as the depth of D1 to thereby form a first trench 120. At the first opening 112, the semiconductor substrate 100 is etched as deeply as the depth of D1, while it is etched as deeply as the depth of D2 which is smaller than that of D1 due to the thickness of the first photoresist film at the second opening 114, thus forming a second trench 122 thinner than the first trench 120.

Figure 2E:
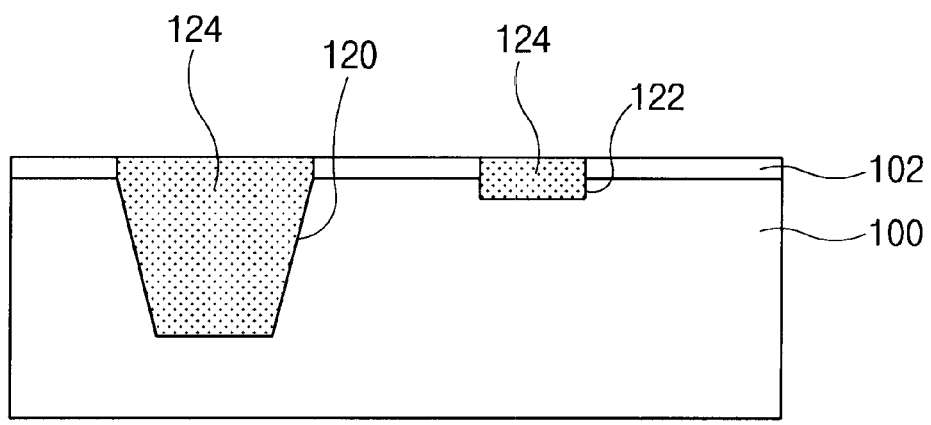

Next, a silicon oxide film is formed in the structure of FIG. 2d, and then is planarized by using the chemical mechanical polishing (CMP) process, thus forming a silicon oxide film 124 only in the first trench 120 and the second trench 122, as illustrated in FIG. 2e. Here, the first trench 120 is a separation region, that is, a field region, of the semiconductor device. In addition, the second trench 122 is a region in which a gate electrode is to be formed.

Figure 2F:
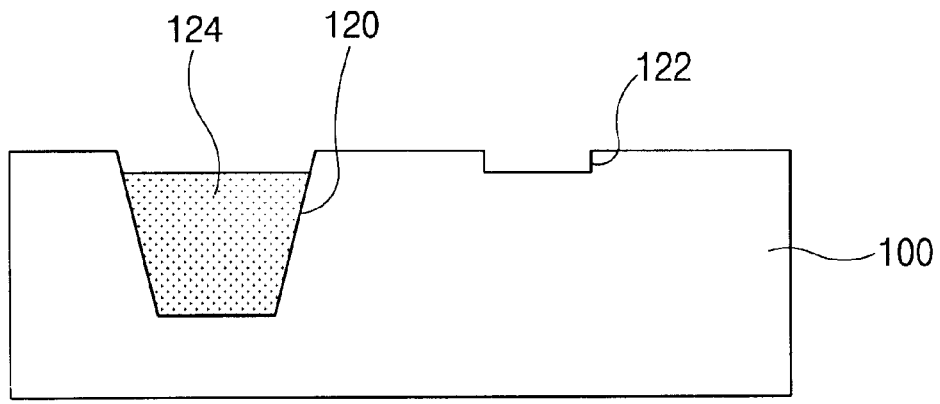

Next, as illustrated in FIG. 2f, the pad oxide film 102 and the oxide film in the second trench 122 are removed by the wet etching method.

Figure 2G:
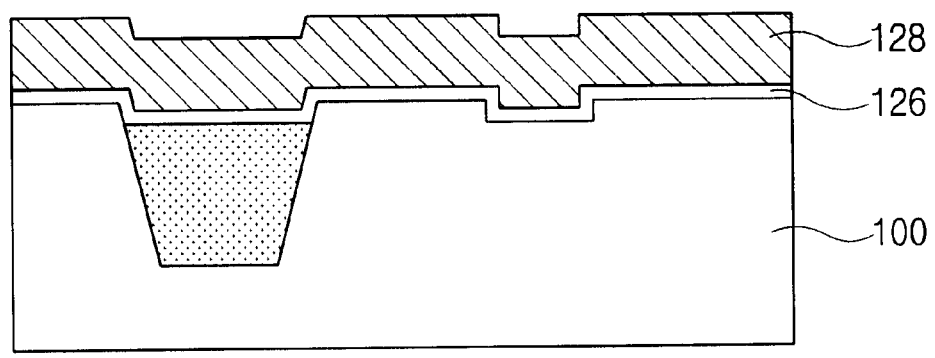

Next, as illustrated in FIG. 2g, a gate oxide film 126 is formed on the top surface of the semiconductor substrate 100, and then a conductive layer 128, such as a polysilicon layer, is formed on a top surface of the gate oxide film 126.

Figure 2H:
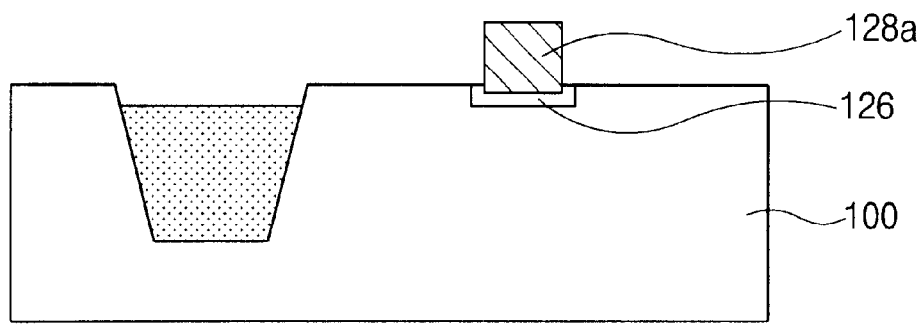

Next, as illustrated in FIG. 2h, the conductive layer 128 is patterned to form a gate electrode 128a in the second trench 122.

Figure 2I:
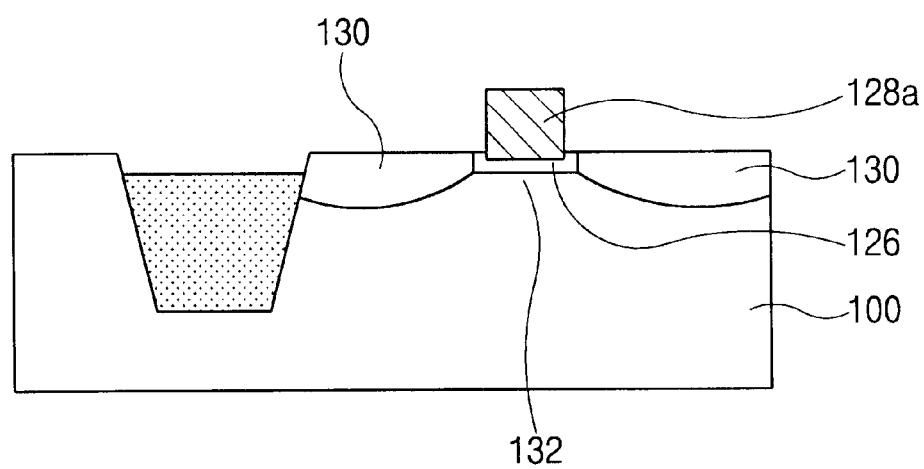

Next, as illustrated in FIG. 2i, impurity ions are implanted into the semiconductor substrate 100 to form a source/drain junction 130 in the semiconductor substrate 100 at both sides of the gate electrode 128a, thereby completing the process for fabricating a semiconductor device according to the present invention.

In other words, as illustrated herein, a semiconductor device having an elevated source/drain scheme in which a channel region 132 below the gate electrode 128a is lower than a top surface of the source/drain junction 130.

The method for fabricating a semiconductor device having an elevated source/drain according to the present invention is an easy process to perform since it does not employ the epitaxial deposition method and has a high punch through effect since there is no possibility of forming a deep junction around the gate electrode. In addition, since a portion in which an elevated gate electrode is to be formed is etched at the same time as a trench etching process for separating the device, there is no need to add a new process step to the conventional process, thus preventing the process for fabricating the device from being complicated.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device having an elevated source/drain scheme, comprising the steps of:

forming a first photoresist film on a top surface of a semiconductor substrate;

forming a second photoresist film on the first photoresist film;

forming a second photoresist film pattern so that a portion corresponding to a field region has a first opening and a region in which a gate electrode is to be formed has a second opening by exposing the second photoresist film to a first light, thereby developing the second photoresist film;

forming a first photoresist film pattern so that a portion corresponding to the field region has a third opening having a portion being overlapped by a portion of the first opening by exposing the first photoresist film to a second light, thereby developing the first photoresist film;

forming a first trench at the first opening position and a second trench at the second opening position on the semiconductor substrate by etching the semiconductor substrate using the first photoresist film pattern and the second photoresist film pattern as a mask;

filling the first trench and the second trench with an oxide film;

removing the oxide film in the second trench;

forming a gate oxide film on inner walls of the first and second trenches and on the top surface of the semiconductor substrate;

forming a gate electrode on a top surface of the second trench by forming a conductive layer on a top surface of the gate oxide film and patterning the conductive layer; and forming a source junction and a drain junction by implanting impurity ions in the semiconductor substrate at both sides of the gate electrode.

2. The method according to claim 1, wherein a depth of the first trench is deeper than that of the second trench.

3. The method according to claim 1, wherein the first opening lies coextensive with the third opening.

4. The method according to claim 1, wherein the first light is an ArF light, and the second light is a KrF light.

5. The method according to claim 1, wherein the method further includes the steps of:

forming a pad oxide film on the top surface of the semiconductor substrate; and forming a nitride film on a top surface of the pad oxide film before forming the first photoresist film and wherein the first photoresist film is formed on a top surface of the nitride film.

6. A method for fabricating a semiconductor device having an elevated source/drain scheme, comprising the steps of:

forming a first photoresist film on a top surface of a semiconductor substrate;

forming a second photoresist film on the first photoresist film;

forming a second photoresist film pattern so that a portion corresponding to a field region has a first opening and a region in which a gate electrode is to be formed has a second opening by exposing the second photoresist film to a first light, thereby developing the second photoresist film;

forming a first photoresist film pattern so that a portion corresponding to the field region has a third opening by exposing the first photoresist film to a second light, thereby developing the first photoresist film, wherein the first opening and the third opening overlap in a portion in which the field region is formed;

forming a first trench at the first opening position and a second trench at the second opening position on the semiconductor substrate by etching the semiconductor substrate using the first photoresist film pattern and the second photoresist film pattern as a mask;

filling the first trench and the second trench with an oxide film;

removing the oxide film in the second trench;

forming a gate oxide film on inner walls of the first and second trenches and on the top surface of the semiconductor substrate;

forming a gate electrode on a top surface of the second trench by forming a conductive layer on a top surface of the gate oxide film and patterning the conductive layer; and forming a source junction and a drain junction by implanting impurity ions in the semiconductor substrate at both sides of the gate electrode.

7. The method according to claim 1, wherein the step of filling the first trench and the second trench with the oxide film includes the steps of:

forming an oxide film on the entire top surface of the semiconductor substrate; and planarizing the oxide film by a chemical mechanical polishing method after the step of forming the first trench and the second trench.

* * * * *